United States Patent
Shin et al.

(10) Patent No.: US 8,610,146 B2
(45) Date of Patent: Dec. 17, 2013

(54) LIGHT EMITTING DIODE PACKAGE AND METHOD OF MANUFACTURING THE SAME

(75) Inventors: Sang Hyun Shin, Gyeonggi-do (KR); Seog Moon Choi, Seoul (KR); Young Ki Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 260 days.

(21) Appl. No.: 12/238,663

(22) Filed: Sep. 26, 2008

(65) Prior Publication Data

US 2010/0032705 A1  Feb. 11, 2010

(30) Foreign Application Priority Data

Aug. 5, 2008  (KR) .................. 10-2008-0076339

(51) Int. Cl.
*H01L 33/00* (2010.01)
*H01L 21/00* (2006.01)

(52) U.S. Cl.
USPC .............. 257/98; 257/E33.057; 257/E21.499; 257/E21.51; 438/26

(58) Field of Classification Search
USPC ........ 257/88, 95, 99, 100, E33.059, E33.058, 257/E33.056, E33.057, E33.075, 79, 81, 257/93, E33.001, E31.001, 98, E21.499, 257/E21.51; 362/249.01, 382; 438/25–28, 438/106, 121, 122
See application file for complete search history.

(56) References Cited

U.S. PATENT DOCUMENTS

| | | | |
|---|---|---|---|
| 7,547,923 B2 * | 6/2009 | Shin et al. | 257/99 |
| 2005/0237747 A1 * | 10/2005 | Shimizu et al. | 362/294 |
| 2006/0124953 A1 * | 6/2006 | Negley et al. | 257/99 |
| 2006/0220036 A1 * | 10/2006 | Lee et al. | 257/81 |
| 2007/0080360 A1 * | 4/2007 | Mirsky et al. | 257/99 |
| 2007/0126093 A1 * | 6/2007 | Ho et al. | 257/675 |
| 2007/0221928 A1 * | 9/2007 | Lee et al. | 257/79 |
| 2008/0266869 A1 * | 10/2008 | Tai et al. | 362/294 |
| 2008/0308925 A1 * | 12/2008 | Shen | 257/706 |
| 2009/0315062 A1 * | 12/2009 | Su et al. | 257/99 |
| 2010/0001305 A1 * | 1/2010 | Lin et al. | 257/99 |

FOREIGN PATENT DOCUMENTS

| | | |
|---|---|---|
| KR | 638881 B1 * | 10/2006 |
| KR | 10-2007-0082614 | 8/2007 |
| KR | 10-2007-0088956 | 8/2007 |

OTHER PUBLICATIONS

Baek 638881 B1 (English translation attached).*

* cited by examiner

*Primary Examiner* — Daniel Luke
*Assistant Examiner* — Latanya N Crawford
(74) *Attorney, Agent, or Firm* — McDermott Will & Emery LLP

(57) ABSTRACT

Provided is an LED package including a metal substrate that has one or more via holes formed therein; an insulating layer that is formed on a surface of the metal substrate including inner surfaces of the via holes; a plurality of metal patterns that are formed on the insulating layer and are electrically isolated from one another; and an LED chip that is mounted on a metal pattern among the plurality of metal patterns.

35 Claims, 14 Drawing Sheets

DICING LINE

LIGHT EMITTING DIODE PACKAGE AND METHOD OF MANUFACTURING THE SAME

CROSS-REFERENCE TO RELATED APPLICATIONS

This application claims the benefit of Korean Patent Application No. 10-2008-0076339 filed with the Korea Intellectual Property Office on Aug. 5, 2008, the disclosure of which is incorporated herein by reference.

BACKGROUND OF THE INVENTION

1. Field of the Invention

The present invention relates to a light emitting diode (LED) package and a method of manufacturing the same.

2. Description of the Related Art

In general, an LED is widely used as a light source because it has a number of advantages such as low power consumption and high brightness.

In particular, the LED is being adopted as a backlight unit for lighting devices and liquid crystal displays (LCD). LED is provided in the form of package which is easily mounted on various devices such as a lighting device and so on. An LED package should not only protect the LED and have a connection structure with devices, but also should have a heat dissipation function for dissipating heat generated from the LED.

The heat dissipation performance is a package condition which is considered to be important in backlight units for lighting device and LCD, which require a high-power LED.

That is, the performance and lifespan of the LED in the LED package may exponentially decrease, as the operation temperature thereof increases. When the operation temperature of the LED increases to more than predetermined temperature, the package may discolor. Therefore, the heat generated from the LED should be dissipated so that the operation temperature should be optimally maintained.

Accordingly, a variety of researches on LED packages have been recently conducted, in order to expand the lifespan of the LED packages by simplifying the structure and enhancing the heat dissipation performance.

SUMMARY OF THE INVENTION

An advantage of the present invention is that it provides an LED package in which an anodizing process is performed on an aluminum substrate having via holes formed therein so as to enhance heat dissipation performance and optical characteristic of the LED package, and a high-power LED chip as well as a low-power LED chip can be used.

Another advantage of the invention is that it provides a method of manufacturing an LED package.

Additional aspect and advantages of the present general inventive concept will be set forth in part in the description which follows and, in part, will be obvious from the description, or may be learned by practice of the general inventive concept.

According to an aspect of the invention, an LED package comprises a metal substrate that has one or more via holes formed therein; an insulating layer that is formed on a surface of the metal substrate including inner surfaces of the via holes; a plurality of metal patterns that are formed on the insulating layer and are electrically isolated from one another; and an LED chip that is mounted on a metal pattern among the plurality of metal patterns.

The metal pattern having the LED chip mounted thereon among the plurality of metal patterns may be formed on the top surface of the metal substrate which is exposed by partially removing the insulating layer.

Any one of the metal patterns formed at the bottom surface of the metal substrate may be formed on the bottom surface of the metal substrate which is exposed by partially removing the insulating layer.

The LED package may further include a wire that connects the LED chip to a metal pattern on which the LED chip is not mounted. The LED chip may be a vertical LED chip.

Alternatively, the LED package may further include a first wire that electrically connects the LED chip to a metal pattern on which the LED chip is not mounted; and a second wire that electrically connects the LED chip to the metal pattern having the LED chip mounted thereon.

Alternatively, the LED package may further include first and second wires that electrically connect the LED chip to the metal patterns on which the LED chip is not mounted.

The metal pattern connected to the first or second wire may be formed on the top surface of the metal substrate which is exposed by partially removing the insulating layer.

The metal pattern having the LED chip mounted thereon among the plurality of metal patterns may be formed on the top surface of a cavity formed by partially removing the insulating layer and the metal substrate.

The LED package may further include a molding portion that covers the LED chip. The molding portion may be composed of any one selected from the group consisting of silicon resin, epoxy resin, and epoxy molding compound (EMC).

The molding portion may be formed by any one of an injection molding method, a transfer molding method, and a pin gate molding method, and may have a trapezoid, rectangular, or hemispherical cross-sectional shape.

The metal substrate may be composed of aluminum.

The insulating layer may be formed through an anodizing process. The anodizing process may be performed using any one of organic acid, sulfuric acid, and mixed acid thereof.

According to another aspect of the invention, a method of manufacturing an LED package comprises forming a plurality of via holes passing through a metal substrate; forming an insulating layer on a surface of the metal substrate including inner surfaces of the via holes; partially exposing the top and bottom surfaces of the metal substrate by partially removing the insulating layer; forming a metal layer on the insulating layer including the exposed portions of the metal substrate; patterning the metal layer so as to form a plurality of metal patterns on the exposed portions of the metal substrate and the insulating layer, the metal patterns being electrically isolated from one another; mounting LED chips on some metal patterns among the plurality of metal patterns; and dicing the metal substrate such that each of the diced substrates includes one LED chip and one or more via holes.

The LED chips may be mounted on the metal patterns formed on the exposed top surface of the metal substrate.

The method may further comprise forming wires which electrically connects the LED chips to the metal patterns; and forming molding portions which covers the LED chips and the wires, after the mounting of the LED chips.

The method may further comprise forming a cavity with a predetermined depth by etching the exposed top surface of the metal substrate, after the exposing of the top and bottom surfaces of the metal substrate.

The dicing of the metal substrate may be performed using a dicing blade or cutting mold.

According to a further aspect of the invention, an LED package comprises a metal substrate that has two or more via holes; an insulating layer that is formed on a surface of the metal substrate including inner surfaces of the via holes; a plurality of metal patterns that are formed on the insulating layer and are electrically isolated from one another; and an LED chip that is mounted on one metal pattern among the plurality of metal patterns.

The metal pattern having the LED chip mounted thereon among the plurality of metal patterns may be formed on the top surface of the metal substrate which is exposed by partially removing the insulating layer.

The metal pattern having the LED chip mounted thereon among the plurality of metal patterns may be formed on the bottom surface of a cavity formed by partially removing the insulating layer and the metal substrate.

The LED package may further comprise a wire that electrically connects the LED chip to a metal pattern on which the LED chip is not mounted. The LED chip may be a vertical LED chip.

Alternatively, the LED package may further comprise first and second wires that electrically connect the LED chip to the metal patterns on which the LED chip is not mounted. The LED chip may be a horizontal LED chip.

The LED chip may have a pair of connection elements formed on the bottom surface thereof, the connection elements being electrically connected to the metal patterns, respectively, which are electrically isolated from each other.

The LED package may further comprise a molding portion that covers the LED chip.

The metal substrate may have a cavity with a predetermined depth which is provided at a position where the LED chip is mounted.

According to a still further aspect of the invention, a method of manufacturing an LED chip comprises forming a plurality of via holes passing through a metal substrate; forming an insulating layer on a surface of the metal substrate including inner surfaces of the via holes; forming a metal layer on the insulating layer; patterning the metal layer so as to form a plurality of metal patterns which are electrically isolated from one another; mounting LED chips on some metal patterns among the plurality of metal patterns; and dicing the metal substrate such that each of the diced substrates includes one LED chip and two or more via holes.

The method may further comprise forming wires which electrically connects the LED chips to the metal patterns on which the LED chips are not formed; and forming molding portions which covers the LED chips and the wires, after the mounting of the LED chips.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
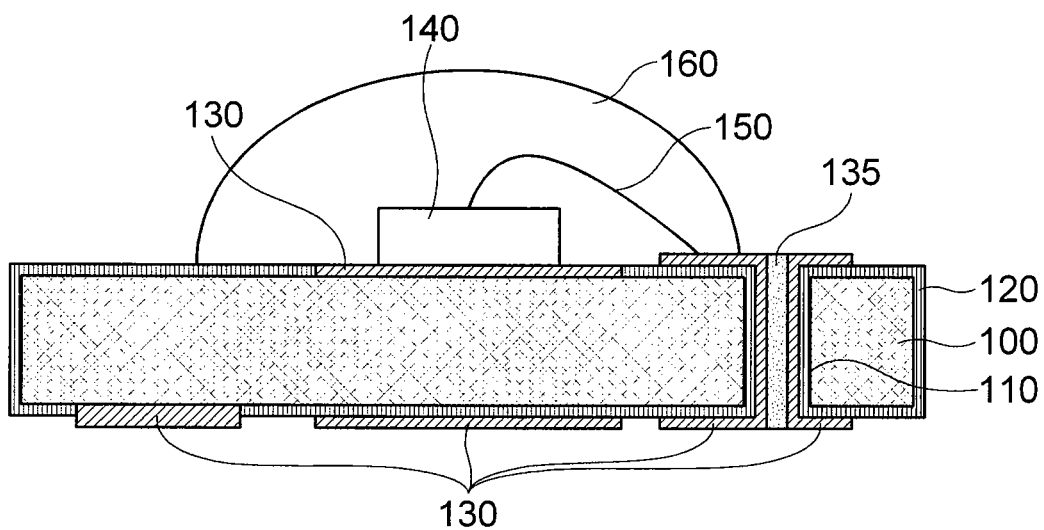
FIGS. 1 and 2 are cross-sectional views of an LED package according to a first embodiment of the invention.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, an LED package and a method of manufacturing the same according to the present invention will be described in detail with reference to the accompanying drawings.

First Embodiment

Structure of LED Package According to First Embodiment

Referring to FIGS. 1 to 4, an LED package according to a first embodiment of the invention will be described.

Figure 2:
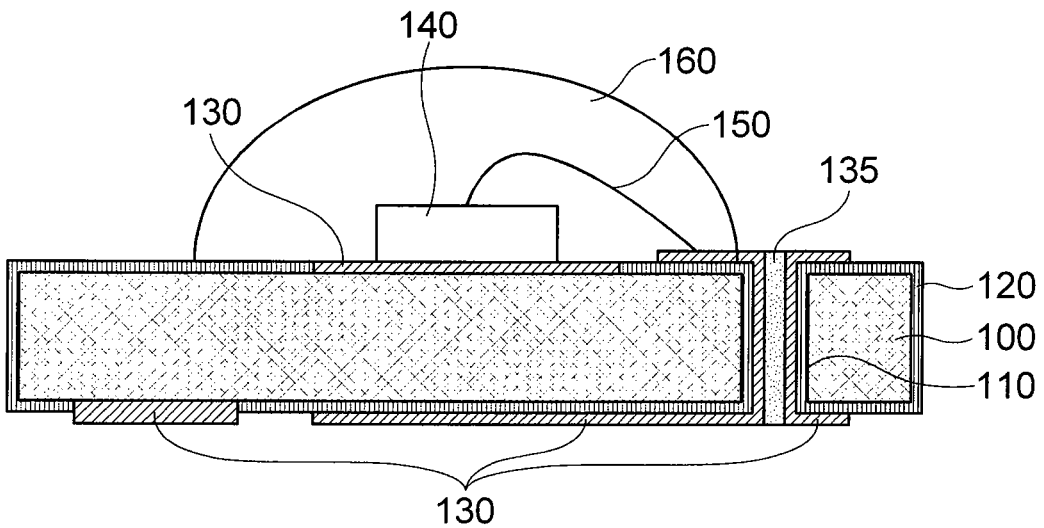

FIGS. 1 and 2 are cross-sectional views of an LED package according to a first embodiment of the invention.

As shown in FIG. 1, the LED package according to the first embodiment of the invention includes a metal substrate 100 having one or more via holes 110 formed therein, an insulating layer 120 which is formed on the surface of the metal substrate 100 including the inner surface of the via hole 110, a plurality of metal patterns 130 which are formed on the insulating layer 120 and are electrically isolated from each other, and an LED chip 140 mounted on a metal pattern 130 among the plurality of metal patterns 130.

The metal substrate 100 may be formed of metal with excellent heat conductivity, such as aluminum (Al).

The insulating layer 120, which is an oxide film layer ($Al_2O_3$), may be formed on the metal substrate 100 composed of aluminum through an anodizing process. The anodizing process may be performed using organic acid, sulfuric acid, or mixed acid thereof.

Aluminum is a metallic material which can be obtained at a relatively low price, and has excellent heat conductivity. Further, the oxide film layer ($Al_2O_3$) obtained through the anodizing process also has relatively high heat conductivity of 10-30 W/mK, and can be formed with a small thickness, thereby implementing low thermal resistance.

Therefore, the metallic substrate 100 exhibits more excellent heat dissipation performance than the conventional substrate formed of copper or ceramic. Further, the anodizing process for anodizing aluminum is a relatively simple process, and the process cost and time thereof are relatively low and short.

The via hole 110 may be formed by a drilling, punching, or etching process, and may serve to electrically connect the metal patterns 130 formed on the top and bottom surfaces of the metal substrate 100.

The via hole 100 may be completely filled up with the insulating layer 120 and the metal patterns 130 which are formed on the inner surface of the via hole 110. As shown in FIG. 1, however, when the insulating layer 120 and the metal patterns 130 are sequentially formed with a small thickness along the inner surface of the via hole 110, the inside of the via hole 110 may not be filled up completely in this case, the internal space of the via hole 110 may be filled up with a via-hole filler 135. The via-hole filler 135 may be composed of a conductive material such as metal or a non-conductive material such as epoxy.

Among the plurality of metal patterns 130, the metal pattern 130 having the LED chip 140 mounted thereon may be formed on the top surface of the metal substrate 100 which is exposed by partially removing the insulating layer 120. In this case, the LED chip 140 may be mounted on the metal pattern 130 formed on the top surface of the metal substrate 100, as described above, but may be mounted across the metal pattern 130 formed on the top surface of the metal substrate 100 and the insulating layer 120 adjacent to the metal pattern 130.

As the metal pattern 130 having the LED chip 140 mounted thereon is not formed on the insulating layer 120 but is directly connected to the top surface of the metal substrate 100, heat generated from the LED chip 140 can be effectively dissipated to the outside.

On the bottom surface of the metal substrate 100, another metal pattern 130 may be formed at a position corresponding to the metal pattern 130 having the LED chip 140 mounted thereon, and serves to effectively dissipate heat generated from the LED chip 140.

In this case, the metal pattern 130, which is formed on the bottom surface of the metal substrate 100 so as to correspond to the LED chip 140, may be electrically isolated from the adjacent metal patterns 130 so as to serve as only a heat dissipation layer, as shown in FIG. 1. However, as shown in FIG. 2, the metal pattern 130 may extend so as to be electrically connected to an adjacent metal pattern 130, thereby serving as both a heat dissipation layer and an electrode.

The LED chip 140 may be a vertical LED chip. In this case, any one electrode (not shown) of the LED chip 140 may be electrically connected to the metal pattern 130 having the LED chip 140 mounted thereon, and another electrode (not shown) of the LED chip 140 may be electrically connected to a metal pattern 130, where the LED chip is not mounted, through a wire 150. At this time, the metal pattern 130 connected to the LED chip 140 through the wire 150 is formed so as to extend to the bottom surface of the metal substrate 100 through the via hole 110.

The wire 150 may be formed of gold, aluminum, or copper.

On the metal substrate 100, a molding portion 160 is formed so as to cover the LED chip 140 and the wire 150.

The molding portion 160 may be formed in a desired shape through an injection molding, transfer molding, or pin-gate molding method using silicon resin, epoxy resin, or epoxy molding compound (EMC).

The molding portion 160 is formed in a hemispherical shape, as shown in FIGS. 1 and 2. Without being limited thereto, however, the molding portion 160 may be formed in various shapes such as a trapezoid, a rectangle, and so on.

Figure 3:
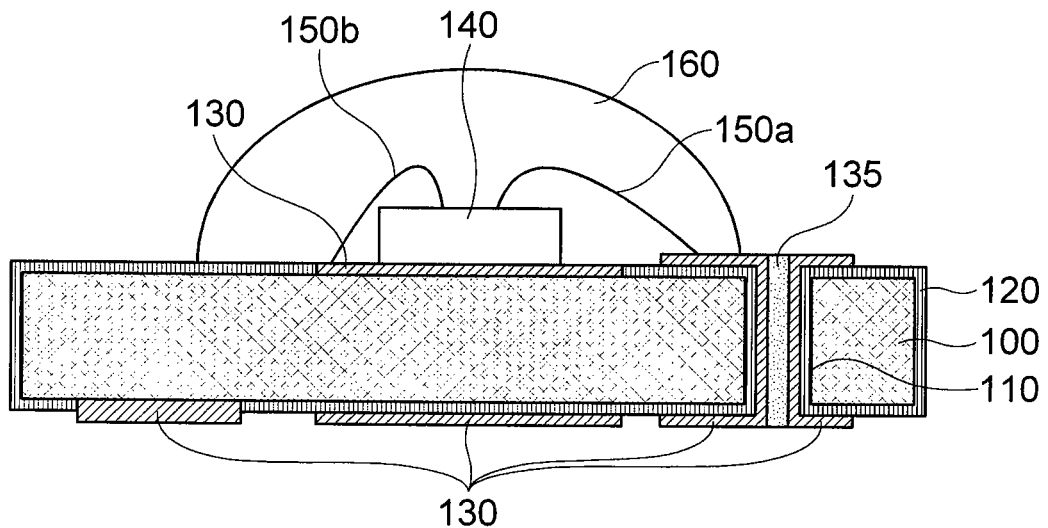
FIGS. 3 and 4 are cross-sectional views showing an example where a horizontal LED chip is mounted on the LED package according to the first embodiment of the invention.
Figure 4:
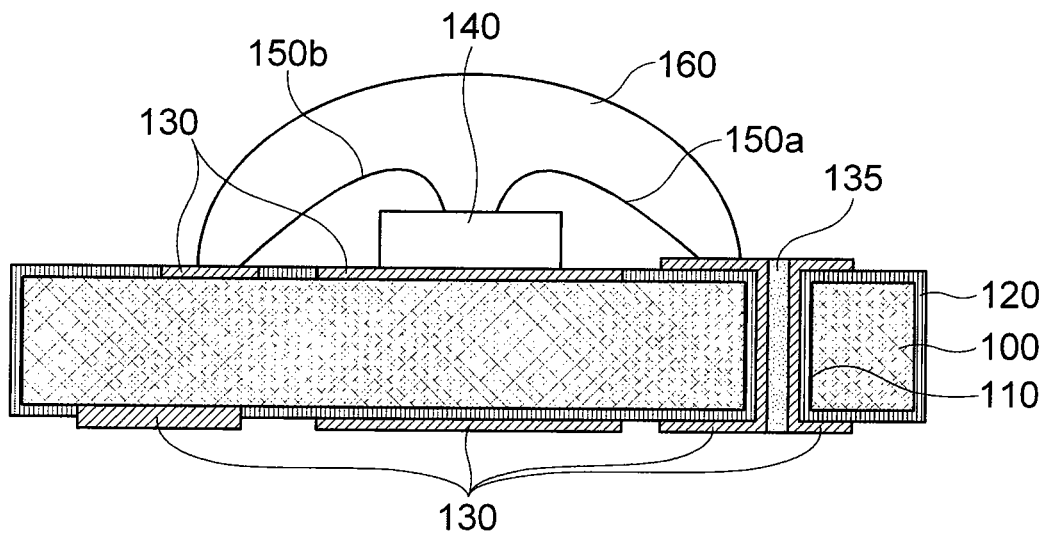

FIGS. 3 and 4 are cross-sectional views showing an example where a horizontal LED chip is mounted on the LED package according to the first embodiment of the invention.

In the first embodiment of the invention, a horizontal LED chip may be used as the LED chip 140, instead of the vertical LED chip. In this case, as shown in FIG. 3, any one electrode (not shown) of the horizontal LED chip 140 may be electrically connected to the metal pattern 130, where the LED chip 140 is not mounted, through a first wire 150a, and another electrode (not shown) thereof may be electrically connected to the metal pattern 130 having the LED chip 140 mounted thereon through a second wire 150b.

At this time, the second wire 150b may not be electrically connected to the metal pattern 130 having the LED chip 140 mounted thereon, as described above, but may be electrically connected to a separate metal pattern 130 where the LED chip 140 is not mounted, as shown in FIG. 4. The separate metal pattern 130 connected to the second wire 150b may be formed on the top surface of the metal substrate 100 which is exposed by partially removing the insulating layer 120.

In the LED package according to the first embodiment of the invention, the metal pattern 130 connected to the via hole 110 and the metal substrate 100 are used as electrodes which are electrically connected to the LED chip 140. Any one metal pattern 130 among the metal patterns 130 formed on the bottom surface of the metal substrate 100 may be formed on the bottom surface of the metal substrate 100, which is exposed by partially removing the insulating layer 120, so as to be directly connected to the metal substrate 100.

Further, by using the metal substrate 100 formed of aluminum where the via hole 110 is formed, it is possible to obtain an excellent heat dissipation effect. Therefore, a high-power LED chip with a relatively large calorific value as well as a low-power LED chip with a relatively low calorific value may be used, which makes it possible to enhance an optical characteristic of the LED package.

Further, as the insulating layer 120 is formed on the metal substrate 100 through the anodizing process, the insulating layer 120 is integrally formed with the metal substrate 100, which makes it possible to enhance the durability of the package.

Figure 5:
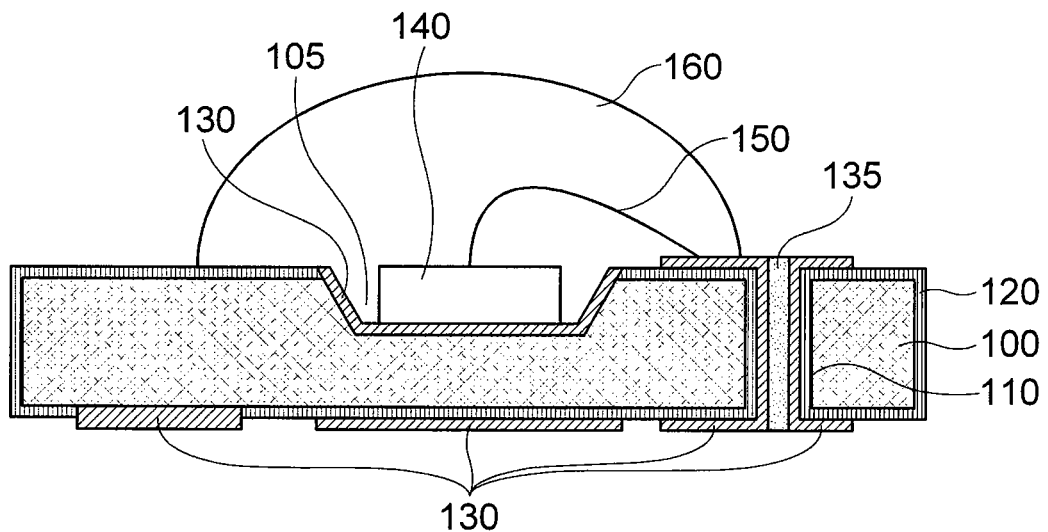
FIG. 5 is a cross-sectional view of an LED package according to a modification of the first embodiment of the invention.

FIG. 5 is a cross-sectional view of an LED package according to a modification of the first embodiment of the invention. As shown in FIG. 5, the metal pattern 130 having the LED chip 140 mounted thereon, among the plurality of metal patterns 130, may be formed on the top surface of a cavity 105 which is formed by partially removing the insulating layer 120 and the metal substrate 100.

When the LED chip 140 is mounted within the cavity 105, the thickness of the metal substrate 100 under the LED chip 140 can be reduced. Therefore, since the heat dissipation path of the LED chip 140 is reduced, it is possible to further enhance the heat dissipation performance of the LED package.

Method of Manufacturing LED Package According to First Embodiment

Referring to FIGS. 6 to 12, a method of manufacturing an LED package according to the first embodiment of the invention will be described.

FIGS. 6 to 12 are process diagrams sequentially showing a method of manufacturing an LED package according to the first embodiment of the invention.

Figure 6:
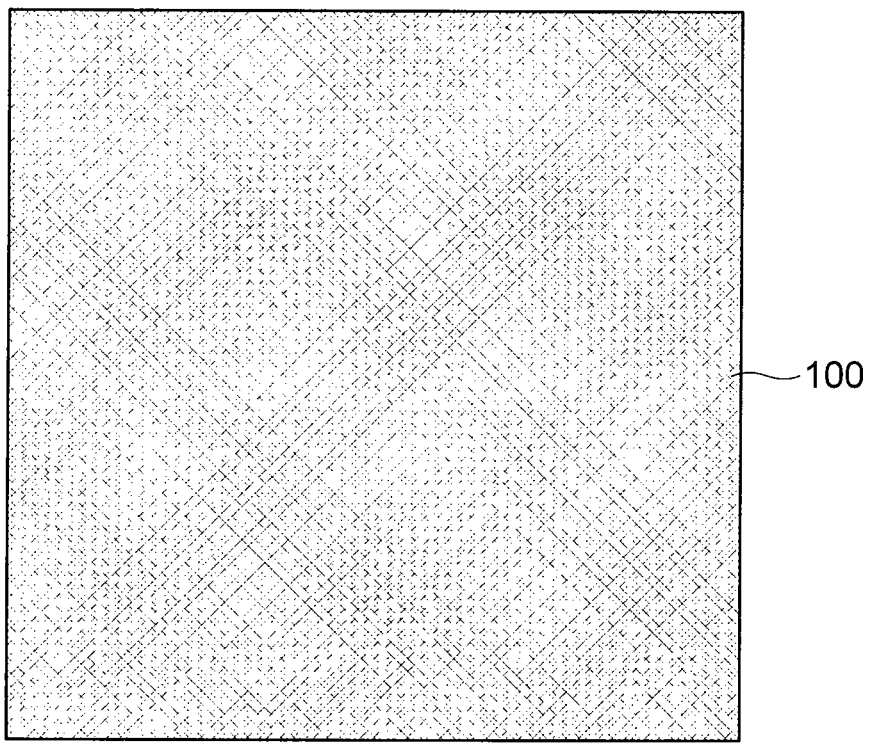
FIGS. 6 to 12 are process diagrams sequentially showing a method of manufacturing an LED package according to the first embodiment of the invention.

As shown in FIG. 6, a metal substrate 100 is prepared.

The metal substrate 100 may be an aluminum plate which has been subjected to a process for cleaning contaminants such as organic matters existing on the surface of the aluminum plate.

As shown in FIG. 6, the metal substrate 100 may be formed in a square shape. Depending on the processed aluminum plate, the metal substrate 100 may be formed in various shapes such as a rectangle, a circle and so on. The thickness of the metal substrate 100 may be set to more than about 0.1 mm, in consideration of the process and the reliability of products after the process.

Figure 7:
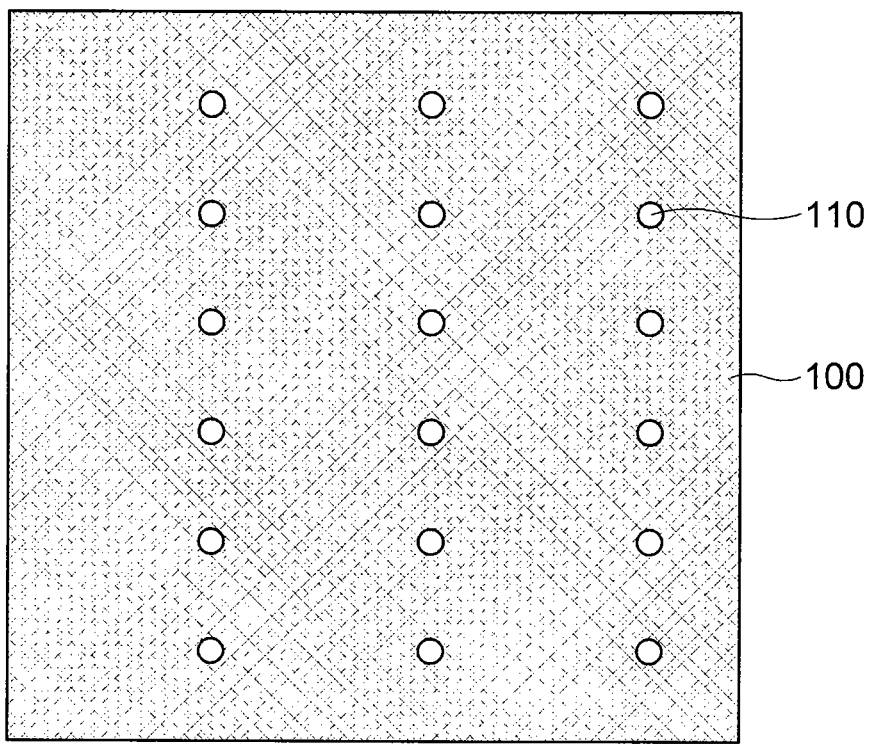

Next, as shown in FIG. 7, a plurality of via holes 110 passing through the metal substrate 100 are formed. As described above, the via holes 110 may be formed by a drilling, punching, or etching process.

Figure 8:
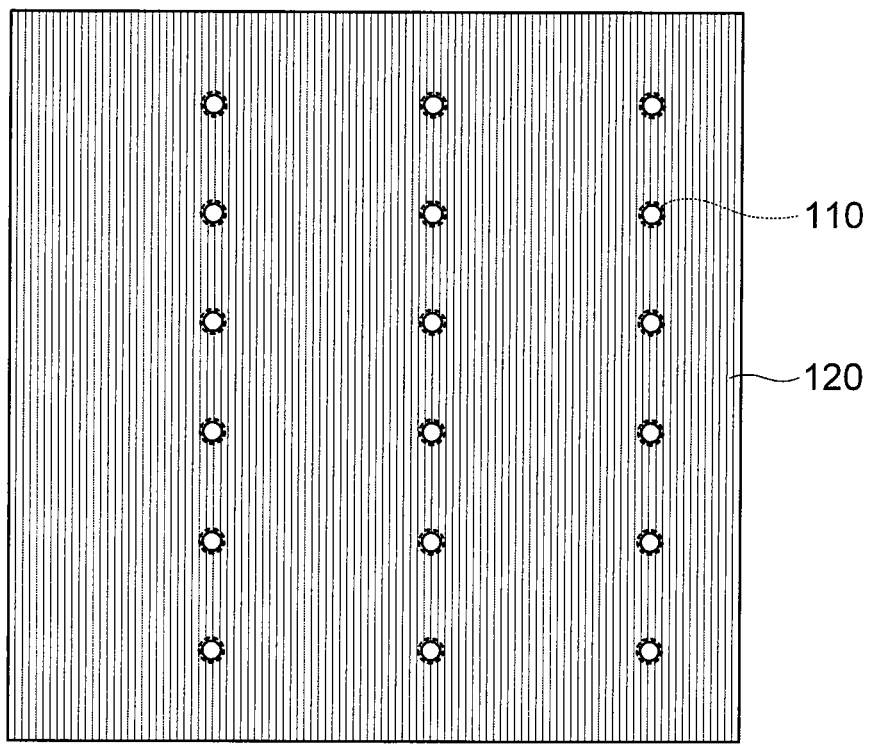

Then, as shown in FIG. 8, an insulating layer 120 is formed on the surface of the metal substrate 100 including the inner surfaces of the via holes 110, through an anodizing process.

Figure 9A:
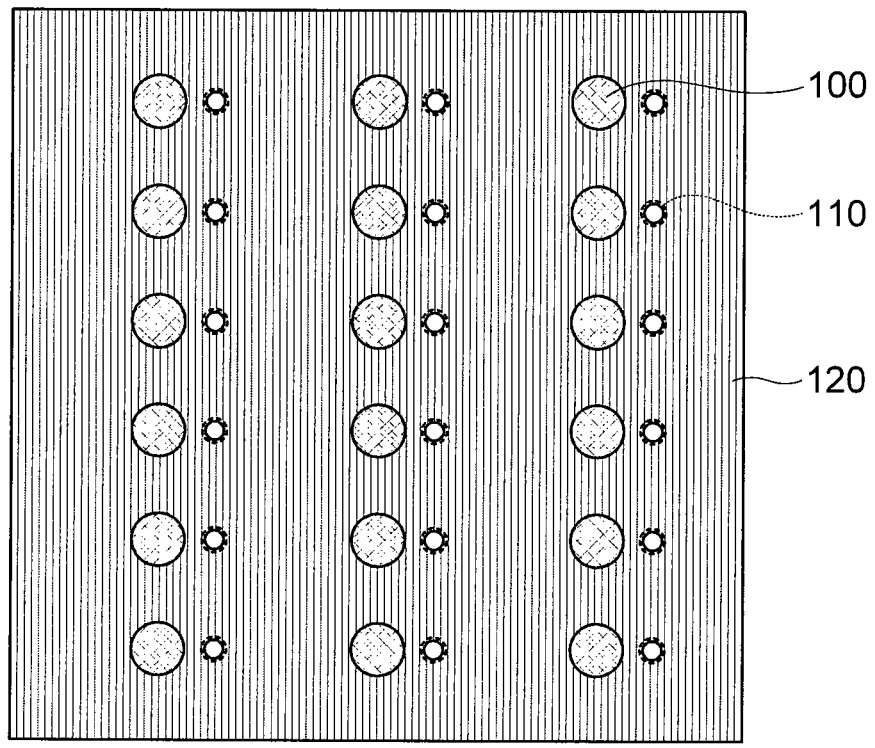
Figure 9B:
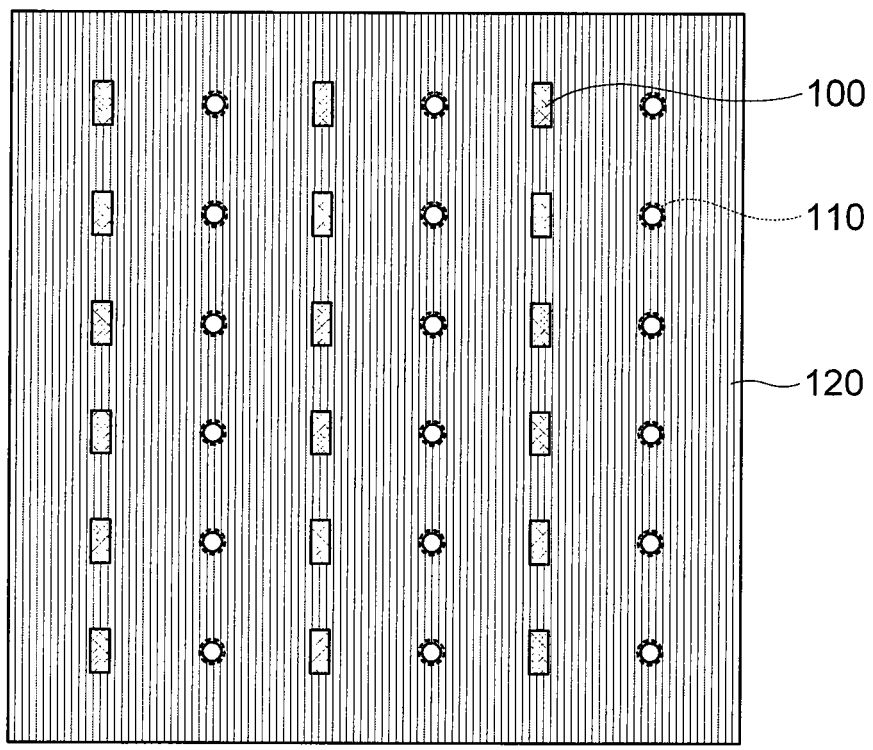

Next, as shown in FIGS. 9A and 9B, the insulating layer 120 is partially removed in such a manner that the top and bottom surfaces of the metal substrate 100 are partially exposed. The removing of the insulating layer 120 may be performed by an etching process.

After the top and bottom surfaces of the metal substrate 100 are partially exposed, the exposed top surface of the metal substrate 100 may be additionally etched so as to form a cavity 105 with a predetermined depth, as shown in FIG. 5.

FIG. 9A shows a state where the top surface of the metal substrate 100 is partially exposed, and FIG. 9B shows a state where the bottom surface of the metal substrate 100 is partially exposed.

Figure 10:
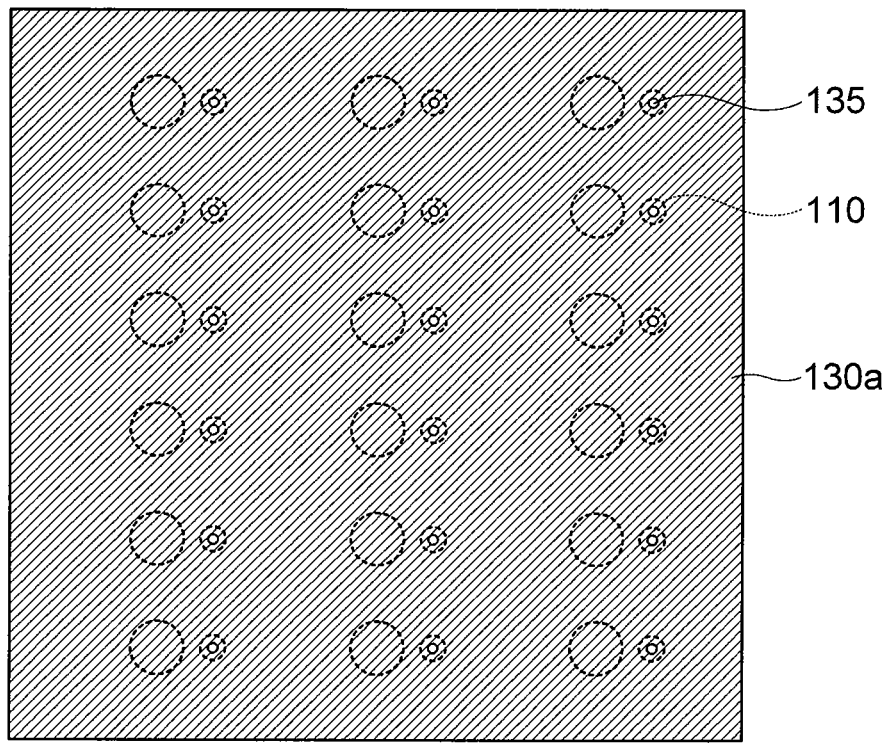

Next, as shown in FIG. 10, a metal layer 130a is formed on the insulating layer 120 including the exposed portions of the metal substrate 100. The metal layer 130a may be formed through an electroplating method, an electroless plating method, or a metal deposition method.

While the metal layer 130a is formed, the via holes 110 may be completely filled up with the metal layer 130a. When the metal layer 130a is thinly formed along the inner surfaces of the via holes 110, the via holes 110 may be not be filled up completely. When the via holes 110 are not filled up completely, a process for filling up the via holes 110 with a via-hole filler 135 may be additionally performed, or may be not performed. The via-hole filler 135 may be composed of a conductive or non-conductive material.

Figure 11:
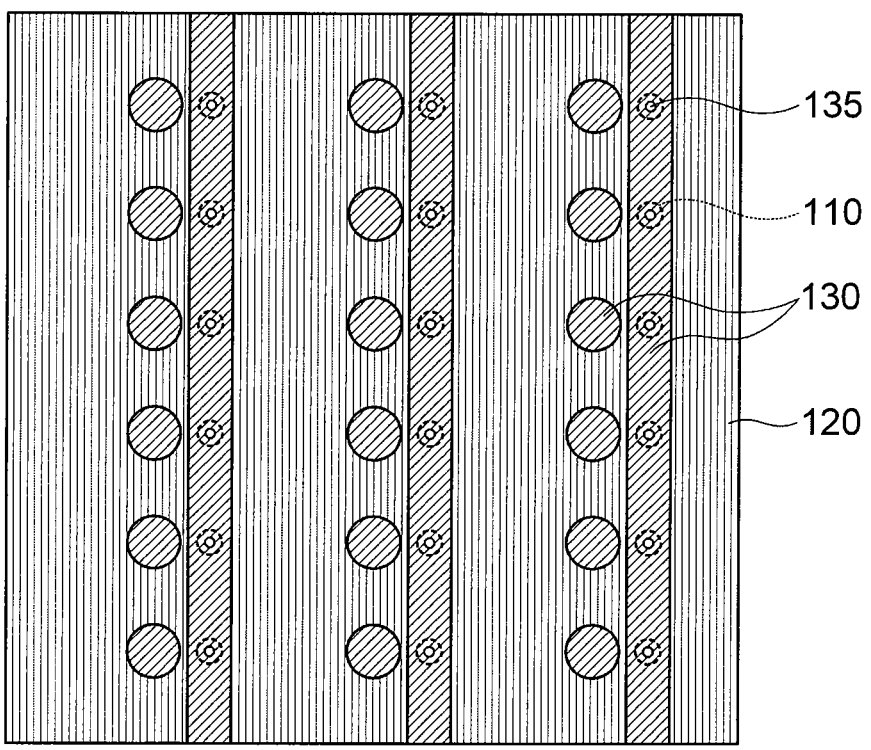

Next, as shown in FIG. 11, the metal layer 130a is patterned so as to form a plurality of metal patterns 130 on the exposed portions of the top and bottom surfaces of the metal substrate 100 and the insulating layer 120, the metal patterns 130 being electrically isolated from one another.

Figure 12:
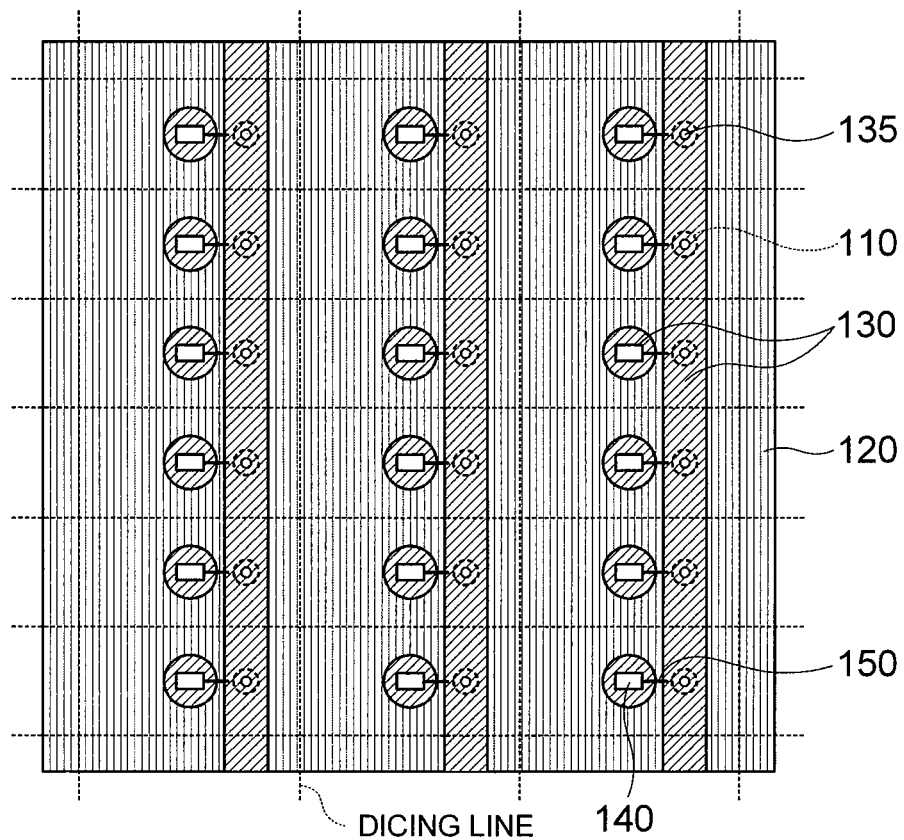

Then, as shown in FIG. 12, LED chips 140 are mounted on the metal patterns 130. In this case, the LED chips 140 may be mounted on the metal patterns 130 formed on the exposed top surface of the metal substrate 100.

When the LED chips 140 are mounted, a die bonding method may be used, in which silver paste, transparent epoxy, or solder is applied on the metal patterns 130 on which the LED chips 140 are to be mounted, and the LED chips 140 mounted on the metal patterns 130 are heat-treated at a predetermined temperature. Alternatively, a fluxless or flux eutectic bonding method may be used.

As the LED chips 140 are mounted on the metal patterns 130 which are directly connected to the top surface of the metal substrate 100, heat generated from the LED chips 140 can be effectively dissipated to the outside through the metal substrate 100.

Next, wires 150 for electrically connecting the LED chips 140 to the metal patterns 130 on which the LED chips 140 are not mounted are formed. Although not shown, molding portions 160 (refer to FIG. 1) are formed on the metal substrate 100 so as to cover the LED chips 140 and the wires 150.

Then, the metal substrate 100 is diced along a dicing line so as to manufacture a plurality of unit LED packages. The unit LED package includes one LED chip 140 and one or more via holes 110. When the metal substrate 100 is diced, a dicing blade or a cutting mold may be used.

Second Embodiment

Structure of LED Package According to Second Embodiment

Referring to FIGS. 13 to 20, an LED package according to a second embodiment of the invention will be described. In the construction of the second embodiment, the duplicated descriptions of the same components as those of the first embodiment will be omitted.

Figure 13:
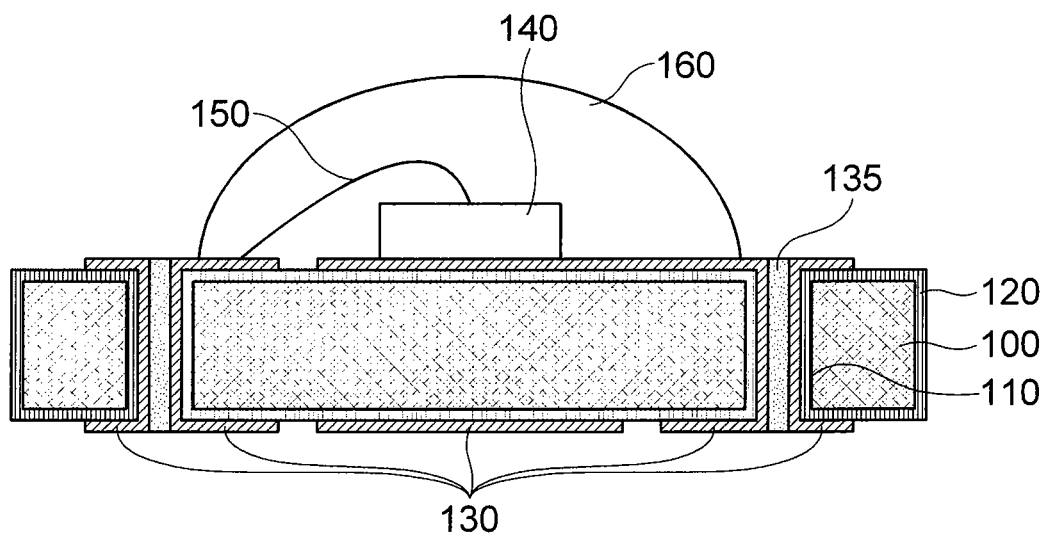
FIG. 13 is a cross-sectional view of an LED package according to a second embodiment of the invention.

FIG. 13 is a cross-sectional view of an LED package according to a second embodiment of the invention. FIGS. 14 to 18 are cross-sectional views of LED packages according to modifications of the second embodiment of the invention.

As shown in FIG. 13, the LED package according to the second embodiment of the invention has almost the same construction as that of the LED package according to the first embodiment, but is different from the first embodiment only in that two or more via holes 110 are formed.

That is, the LED package according to the second embodiment of the invention includes a metal substrate 100 having two or more via holes 110 formed therein, an insulating layer 120 which is formed on the surface of the metal substrate including the inner surfaces of the via holes 110, a plurality of metal patterns 130 which are formed on the insulating layer 120 and are electrically isolated from each other, and an LED chip 140 which is mounted on a metal pattern 130 among the plurality of metal patterns 130.

The metal substrate 100 may be formed of aluminum, and the insulating layer 120 may be composed of an oxide film layer ($Al_2O_3$) which is formed through an anodizing process.

Figure 14:
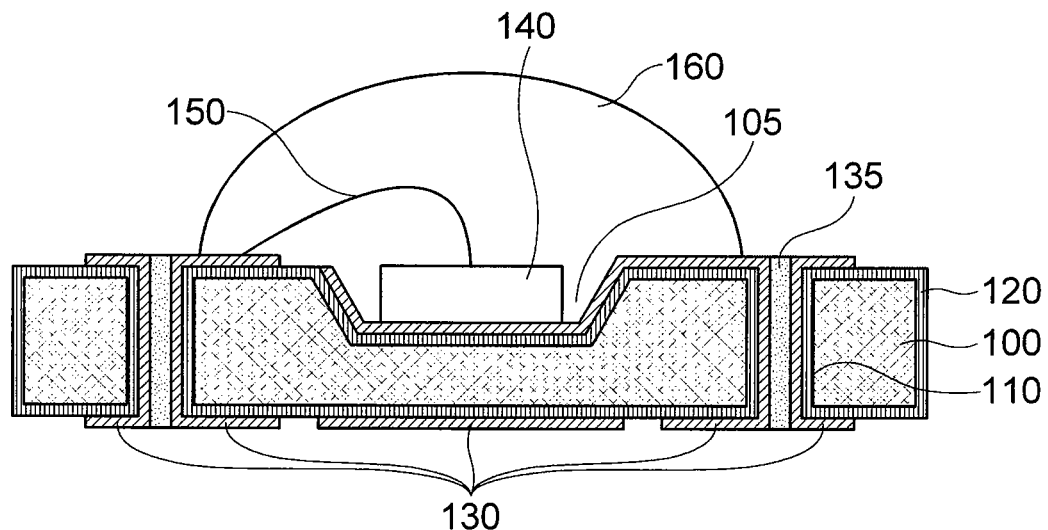
FIGS. 14 to 18 are cross-sectional views of LED packages according to modifications of the second embodiment of the invention.

As shown in FIG. 14, the metal substrate 100 may have a cavity 105 provided in a position where the LED chip 140 is mounted, the cavity 105 having a predetermined depth. When the cavity 105 is provided in the metal substrate 100, the thickness of the metal substrate 100 under the LED chip 140 can be reduced, which makes it possible to increase a heat dissipation effect where heat generated from the LED chip 140 is dissipated to the outside through the metal substrate 100.

On the bottom surface of the metal substrate 100, a metal pattern 130 may be formed in a position corresponding to the portion where the LED chip 140 is mounted, and serves to effectively dissipate heat generated from the LED chip 140.

Figure 15:
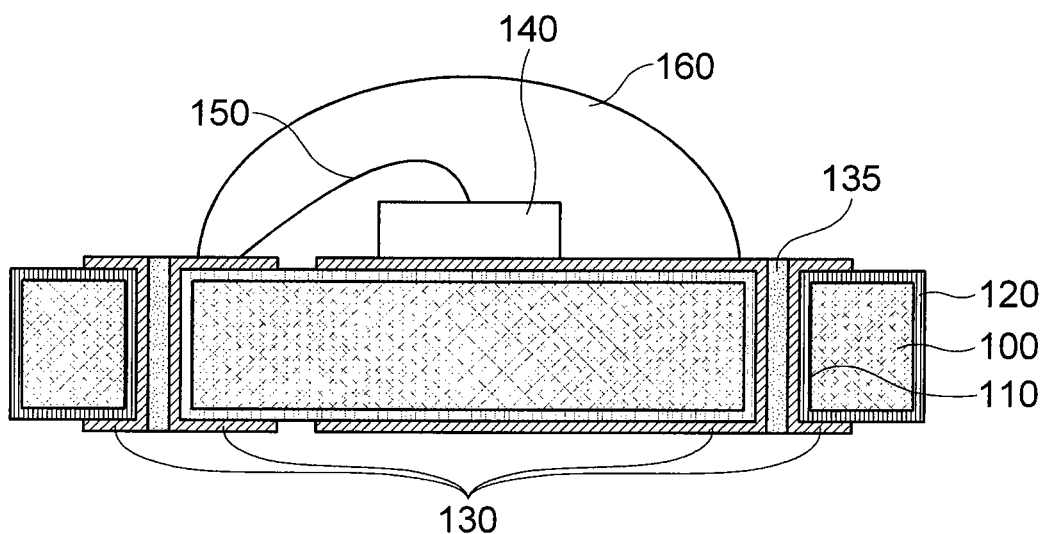

The metal pattern 130, which is formed on the bottom surface of the metal substrate 100 so as to correspond to the LED chip 140, may be electrically isolated from the adjacent metal patterns 130 so as to serve as only a heat dissipation layer, as shown in FIG. 13. However, as shown in FIG. 15, the metal pattern 130 may extend so as to be electrically connected to an adjacent metal pattern 130, thereby serving as both a heat dissipation layer and an electrode.

Figure 16:
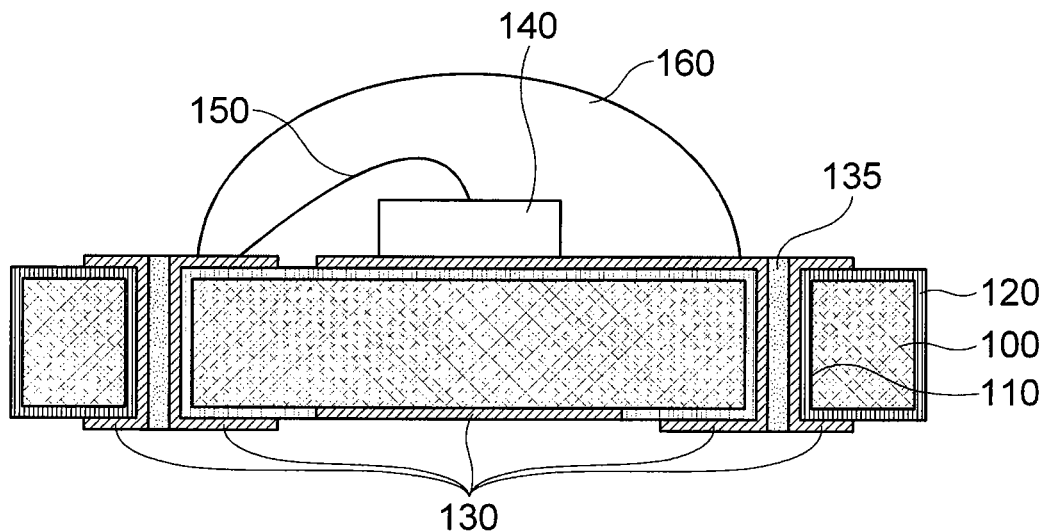

The metal pattern 130, which is formed on the bottom surface of the metal substrate 100 so as to correspond to the LED chip 140, may be formed on the insulating layer 120 formed on the bottom surface of the metal substrate 100, as shown in FIG. 13. However, as shown in FIG. 16, the metal pattern 130 may be formed so as to be directly connected to the bottom surface of the metal substrate 100 which is exposed by partially removing the insulating layer 120. In this case, it is possible to further increase a heat dissipation effect.

Figure 17:
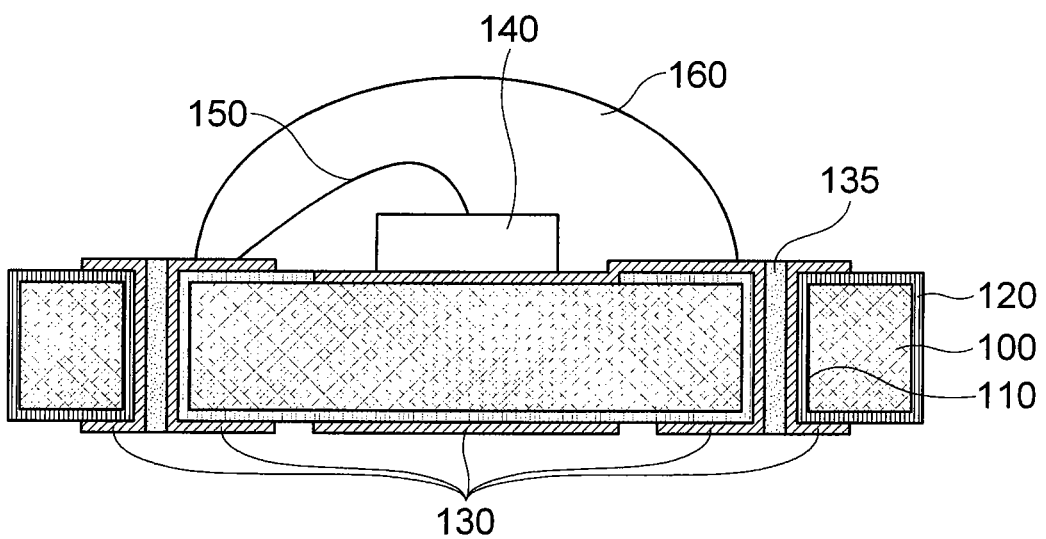

Among the plurality of metal patterns 130, the metal pattern 130 having the LED chip 140 mounted thereon may be formed on the top surface of the insulating layer 120, as shown in FIG. 13. However, as shown in FIG. 17, the metal pattern 130 may be formed on the top surface of the metal substrate 100 which is exposed by partially removing the insulating layer 120. In this case, as the metal pattern 130 having the LED chip 140 mounted thereon is electrically connected to the top surface of the metal substrate 100, the heat generated from the LED chip 140 can be effectively dissipated to the outside through the metal substrate 100.

Figure 18:
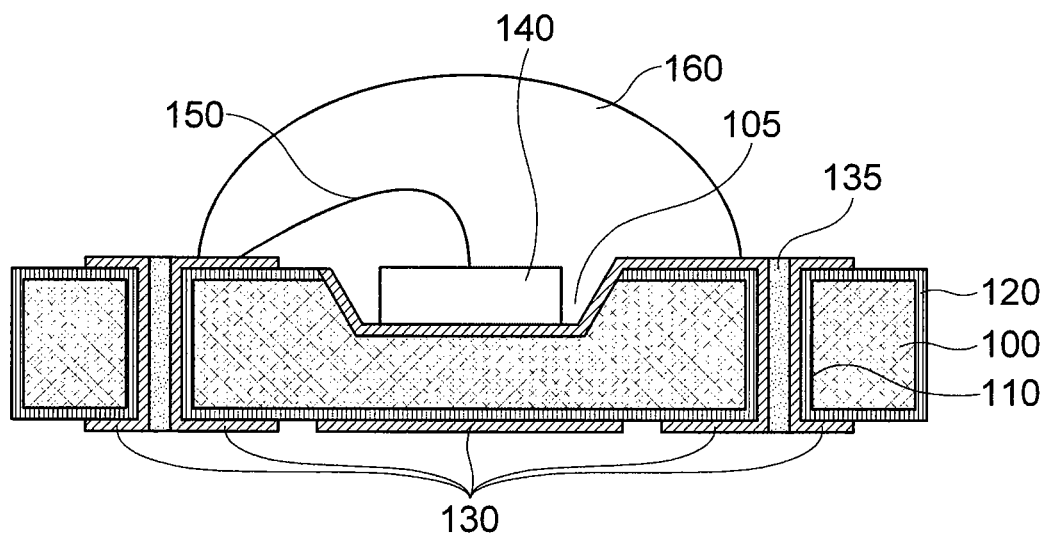

As shown in FIG. 18, the metal pattern 130 having the LED chip 140 mounted thereon may be formed on the top surface of a cavity 105 which is formed by partially removing the insulating layer 120 and the metal substrate 100.

When the LED chip 140 is mounted in the cavity 105, the thickness of the metal substrate 100 under the LED chip 140 can be reduced. Therefore, it is possible to maximize the heat dissipation effect where the heat generated from the LED chip 140 is dissipated to the outside through the metal substrate 100.

The LED chip 140 may be a vertical, horizontal, or flip-chip LED chip.

When the LED chip 140 is a vertical LED chip, any one electrode (not shown) of the LED chip 140 may be electrically connected to the metal pattern 130 having the LED chip 140 mounted thereon, and another electrode (not shown) thereof may be electrically connected to the metal pattern 130, where the LED chip 140 is not mounted, through a wire 150, as shown in FIGS. 13 to 18.

On the metal substrate 100, a molding portion 160 is formed so as to cover the LED chip 140 and the wire 150.

Figure 19:
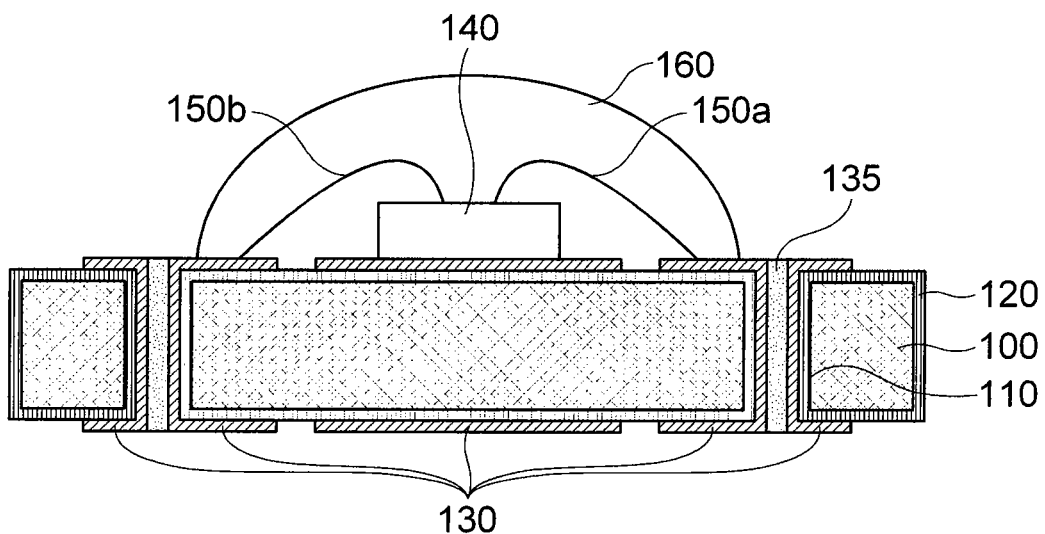
FIG. 19 is a cross-sectional view showing an example where a horizontal LED chip is mounted on the LED package according to the second embodiment of the invention.
Figure 20:
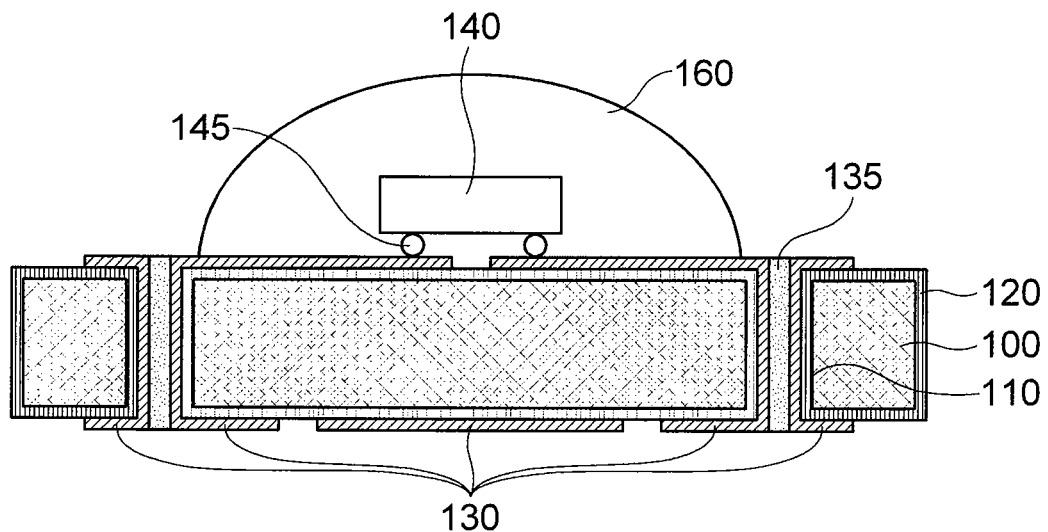
FIG. 20 is a cross-sectional view showing an example where a flip-chip LED chip is mounted on the LED package according to the second embodiment of the invention.

FIG. 19 is a cross-sectional view showing an example where a horizontal LED chip is mounted on the LED package according to the second embodiment of the invention. FIG. 20 is a cross-sectional view showing an example where a flip-chip LED chip is mounted on the LED package according to the second embodiment of the invention.

When the LED chip 140 is a horizontal LED chip, any one electrode (not shown) of the horizontal LED chip 140 may be electrically connected to a metal pattern 130, where the LED chip 140 is not mounted, through a first wire 150a, and another electrode (not shown) thereof may be electrically connected to another metal pattern 130, where the LED chip 140 is not mounted, through a second wire 150b, as shown in FIG. 19.

When the LED chip 140 is a flip-chip LED chip, a pair of connection elements 145 are formed on the bottom surface of the LED chip 140 so as to be electrically connected to the electrodes of the LED chip 140, as shown in FIG. 20. The respective connection elements 145 may be electrically connected to the metal patterns 130 which are electrically isolated from each other.

The connection elements 145 may be composed of solder balls, bumps, or pads.

In the LED package according to the second embodiment of the invention, as the LED chip is mounted on the metal substrate which is formed of aluminum and has been subjected to the anodizing process, it is possible to obtain the same operation and effect as that of the first embodiment.

Method of Manufacturing LED Package According to Second Embodiment

Referring to FIGS. 21 to 26, a method of manufacturing an LED package according to the second embodiment of the invention will be described. In the construction of the second embodiment, the duplicated descriptions of the same components as those of the first embodiment will be omitted.

FIGS. 21 to 26 are process diagrams sequentially showing a method of manufacturing an LED package according to the second embodiment of the invention.

Figure 21:
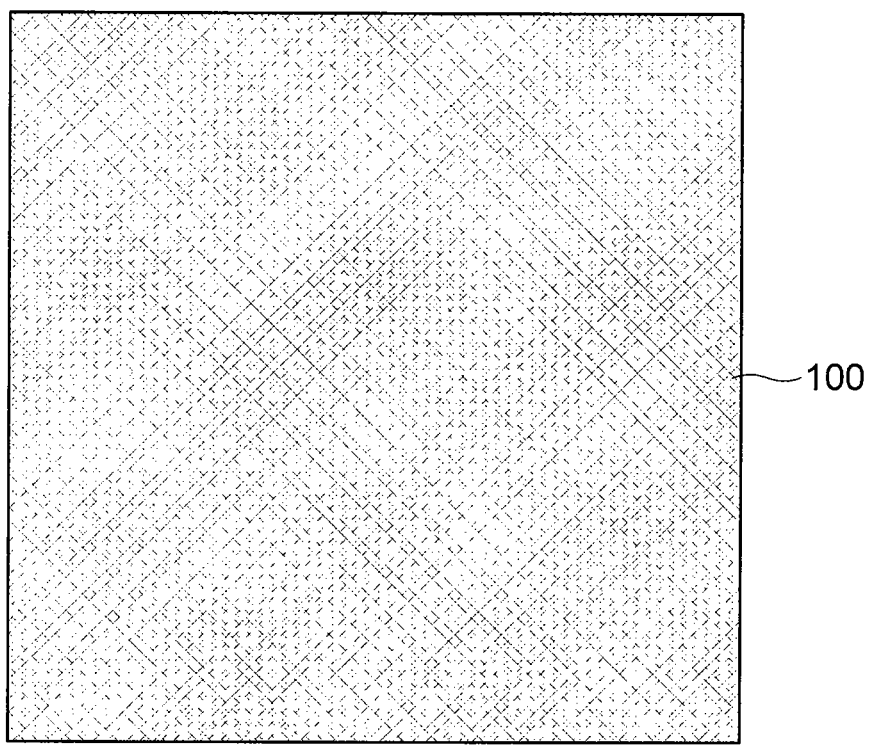
FIGS. 21 to 26 are process diagrams sequentially showing a method of manufacturing an LED package according to the second embodiment of the invention.

First, as shown in FIG. 21, a metal substrate 100 is prepared.

Figure 22:
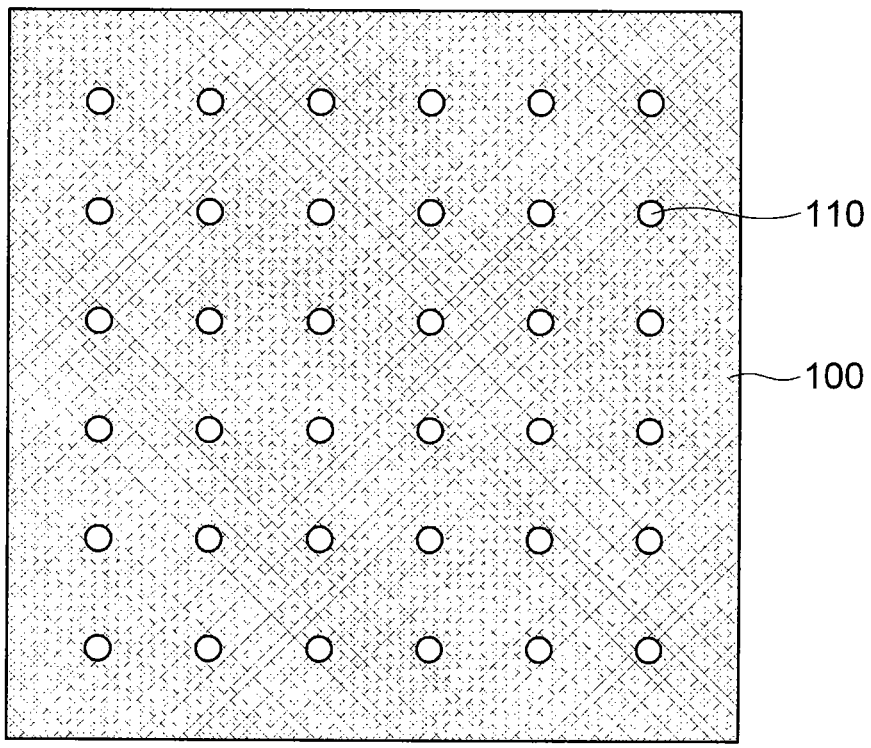

Next, as shown in FIG. 22, a plurality of via holes 110 are formed so as to pass through the metal substrate 100.

Figure 23:
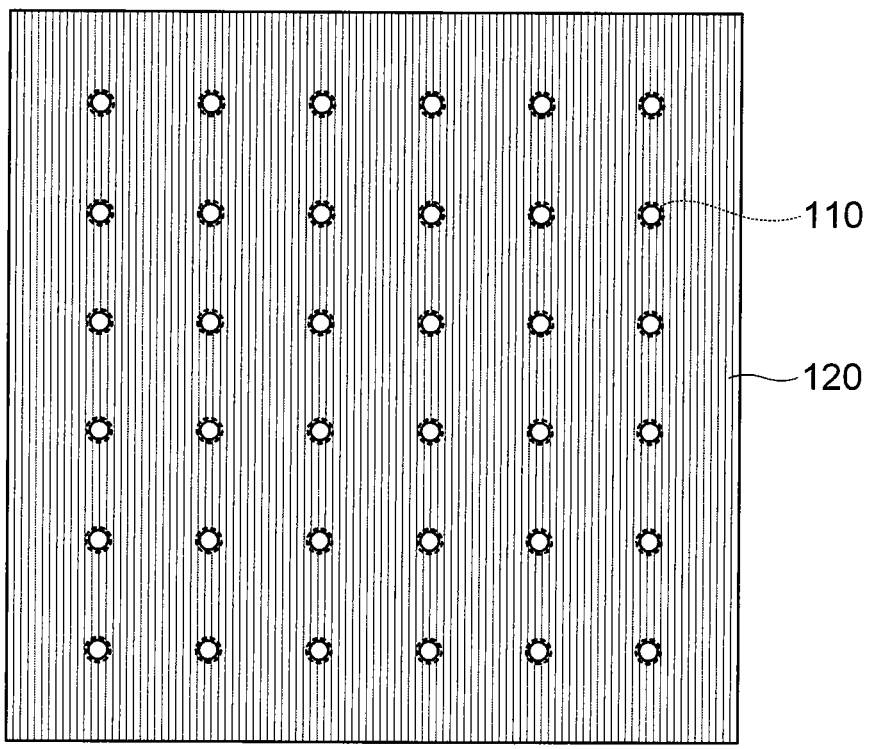

Then, as shown in FIG. 23, an insulating layer 120 is formed on the surface of the metal substrate including the inner surfaces of the via holes 110, through an anodizing process.

Figure 24:
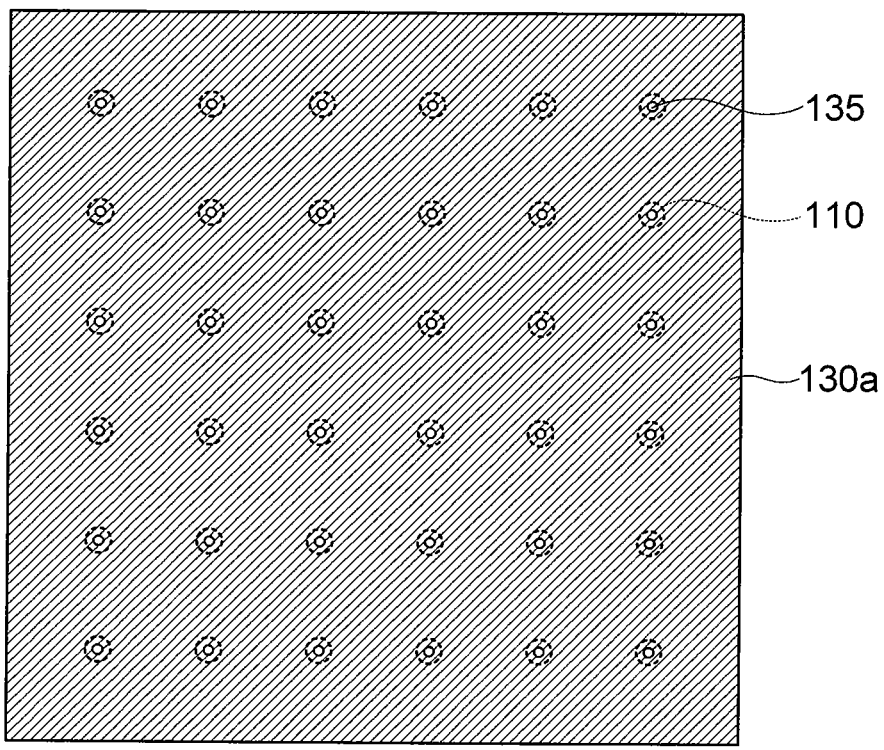

Next, as shown in FIG. 24, a metal layer 130a is formed on the insulating layer 120.

When the via holes 110 are not filled up completely with the metal layer 130a during the forming of the metal layer 130a, a process for filling up the via holes 110 with a via-hole filler 135 may be additionally performed.

Figure 25:
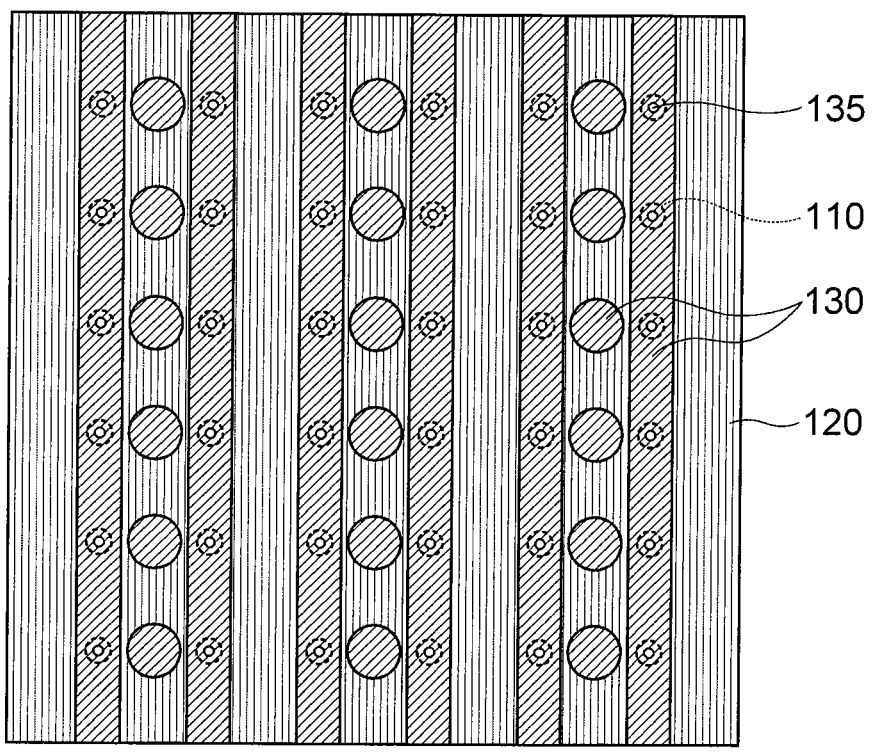

Then, as shown in FIG. 25, the metal layer 130a is patterned so as to form a plurality of metal patterns 130 on the insulating layer 120, the metal patterns 130 being electrically isolated from one another.

Figure 26:
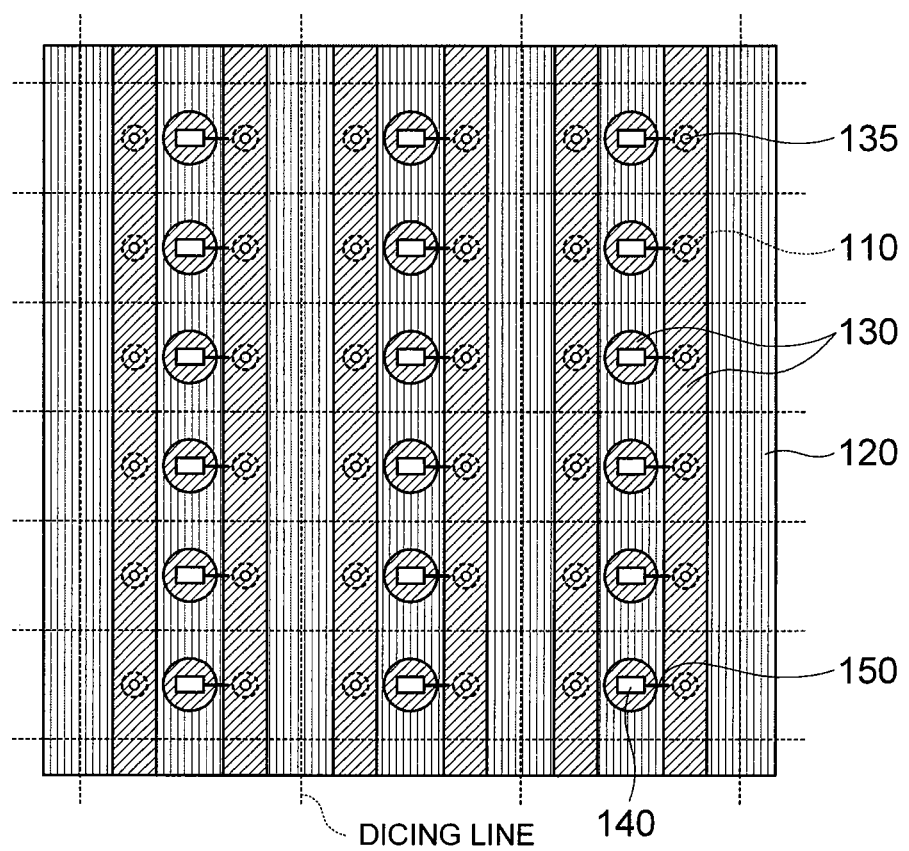

Next, as shown in FIG. 26, LED chips 140 are mounted on some metal patterns 130, and wires 150 for electrically connecting the LED chips 140 to other metal patterns 130, where the LED chips 140 are not mounted, are formed.

Although not shown, molding portions 160 (refer to FIG. 13) are formed on the metal substrate 100 so as to cover the LED chips 140 and the wires 150.

Next, the metal substrate 100 is diced along a dicing line so as to manufacture a plurality of unit LED packages. The unit LED package includes one LED chip 140 and two or more via holes 110.

According to the present invention, as the LED chip is mounted on the metal substrate formed of aluminum, the heat generated from the LED chip can be effectively dissipated to the outside through the metal substrate. Therefore, it is possible to enhance the heat dissipation performance of the LED package.

In the LED package, a high-power LED chip with a relatively large calorific value as well as a low-power LED chip with a relatively low calorific value may be used, which makes it possible to enhance an optical characteristic of the LED package and to expand the lifespan of the LED package.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A light emitting diode (LED) package comprising:
   a metal substrate that has one or more via holes formed therein;
   an insulating layer that has one or more grooves and is formed on a surface of the metal substrate including inner surfaces of the via holes;
   a plurality of metal patterns, of which at least one is formed on a top surface of the insulating layer and of which a different at least one is disposed in the one or more grooves, and which are electrically isolated from one another; and
   an LED chip that is mounted on a metal pattern among the plurality of metal patterns,
   wherein the metal pattern having the LED chip mounted thereon, among the plurality of metal patterns, is formed on the top surface of the metal substrate.

2. The LED package according to claim 1, wherein any one of the metal patterns formed at the bottom surface of the metal substrate is formed on the bottom surface of the metal substrate which is exposed by partially removing the insulating layer.

3. The LED package according to claim 1 further comprising: a wire that connects the LED chip to a metal pattern on which the LED chip is not mounted.

4. The LED package according to claim 1 further comprising:
a first wire that electrically connects the LED chip to a metal pattern on which the LED chip is not mounted; and
a second wire that electrically connects the LED chip to the metal pattern having the LED chip mounted thereon.

5. The LED package according to claim 1 further comprising:
first and second wires that electrically connect the LED chip to the metal patterns on which the LED chip is not mounted.

6. The LED package according to claim 1,
wherein the metal pattern having the LED chip mounted thereon among the plurality of metal patterns is formed on the top surface of a cavity formed by partially removing the metal substrate.

7. The LED package according to claim 1 further comprising:
a molding portion that covers the LED chip.

8. The LED package according to claim 1,
wherein the metal substrate is composed of aluminum.

9. The LED package according to claim 1,
wherein the insulating layer is formed through an anodizing process.

10. The LED package according to claim 3,
wherein the LED chip is a vertical LED chip.

11. The LED package according to claim 4,
wherein the LED chip is a horizontal LED chip.

12. The LED package according to claim 7,
wherein the molding portion is composed of any one selected from the group consisting of silicon resin, epoxy resin, and epoxy molding compound (EMC).

13. The LED package according to claim 7,
Wherein the molding portions is formed by any one of an injection molding method, a transfer molding method, and a pin gate molding method.

14. The LED package according to claim 7,
wherein the molding portion has a trapezoid, rectangular, or hemispherical cross-section shape.

15. The LED package according to claim 8,
wherein the anodizing process is performed using any one of organic acid, sulfuric acid, and mixed acid thereof.

16. A light emitting diode (LED) package comprising:
a metal substrate having one or more via holes formed therein;
an insulating layer having one or more grooves and formed on a surface of the metal substrate including inner surfaces of the via holes;
a plurality of metal patterns electrically isolated from one another, at least one of which is disposed on a top surface of the insulating layer and a different one of which is disposed in one of the grooves;
an LED chip that is mounted on a metal pattern among the plurality of metal patterns; and
at least one wire that electrically connects the LED chip to the metal patterns on which the LED chip is not mounted,
wherein the metal pattern connected to the at least one wire is formed on the top surface of the metal substrate which is exposed by partially removing the insulating layer.

17. An LED package comprising:
a metal substrate that has two or more via holes;
an insulating layer that has one or more grooves and is formed on a surface of the metal substrate including inner surfaces of the via holes;
a plurality of metal patterns electrically isolated from one another, at least one of which is disposed on a top surface of the insulating layer and at least a different one of which is disposed in one of the grooves; and
a LED chip that is mounted on one of the plurality of metal patterns,
wherein the metal pattern having the LED chip mounted thereon, is disposed on the top surface of the metal substrate.

18. The LED package according to claim 17,
wherein the metal pattern having the LED chip mounted thereon among the plurality of metal patterns is formed on the bottom surface of a cavity formed by partially removing the metal substrate.

19. The LED package according to claim 17 further comprising:
a wire that electrically connects the LED chip to a metal pattern on which the LED chip is not mounted.

20. The LED package according to claim 17,
wherein the LED chip is a vertical LED chip.

21. The LED package according to claim 17 further comprising:
first and second wires that electrically connect the LED chip to the metal patterns on which the LED chip is not mounted.

22. The LED package according to claim 17,
wherein the LED chip has a pair of connection elements formed on the bottom surface thereof, the connection elements being electrically connected to the metal patterns, respectively, which are electrically isolated from each other.

23. The LED package according to claim 17 further comprising:
a molding portion that covers the LED chip.

24. The LED package according to claim 17,
wherein the metal substrate is formed of aluminum.

25. The LED package according to claim 17,
wherein the insulating layer is formed through an anodizing process.

26. The LED package according to claim 17,
wherein the metal substrate has a cavity with a predetermined depth which is provided at a position where the LED chip is mounted.

27. The LED package according to claim 21,
wherein the LED chip has a pair of electrodes disposed in a same direction.

28. The LED package according to claim 22,
wherein the LED chip is a flip-chip LED chip.

29. A method of manufacturing an LED package, comprising:
forming a plurality of via holes passing through a metal substrate;
forming an insulating layer on a surface of the metal substrate including inner surfaces of the via holes;
partially exposing the top and bottom surfaces of the metal substrate by partially removing the insulating layer;
forming a metal layer on the insulating layer including the exposed portions of the metal substrate;
patterning the metal layer so as to form a plurality of metal patterns on the exposed portions of the metal substrate and the insulating layer, the metal patterns being electrically isolated from one another;
mounting LED chips on some metal patterns among the plurality of metal patterns; and
dicing the metal substrate such that each of the diced substrates includes one LED chip and one or more via holes.

30. The method according to claim 29,
wherein the LED chips are mounted on the metal patterns formed on the exposed top surface of the metal substrate.

31. The method according to claim 29 further comprising:
after the mounting of the LED chips;
forming wires which electrically connect the LED chips to the metal patterns; and
forming molding portions which cover the LED chips and the wires.

32. The method according to claim 29 further comprising:
after the exposing of the top and bottom surfaces of the metal substrate,
forming a cavity with a predetermined depth by etching the exposed top surface of the metal substrate.

33. The method according to claim 29,
wherein the dicing of the metal substrate is performed using a dicing blade or cutting mold.

34. The method according to claim 29,
wherein the metal substrate is formed of aluminum.

35. The method according to claim 29,
wherein the insulating layer is formed through an anodizing process.

* * * * *